(12) United States Patent
Aiso

(10) Patent No.: US 7,470,961 B2
(45) Date of Patent: Dec. 30, 2008

(54) SEMICONDUCTOR DEVICE AND METHOD OF MANUFACTURING THE SAME

(75) Inventor: Fumiki Aiso, Tokyo (JP)

(73) Assignee: Elpida Memory Inc., Tokyo (JP)

( * ) Notice: Subject to any disclaimer, the term of this patent is extended or adjusted under 35 U.S.C. 154(b) by 420 days.

(21) Appl. No.: 11/435,894

(22) Filed: May 18, 2006

(65) Prior Publication Data

US 2006/0267118 A1 Nov. 30, 2006

(30) Foreign Application Priority Data

May 19, 2005 (JP) ............................. 2005-147308

(51) Int. Cl.
*H01L 29/94* (2006.01)
(52) U.S. Cl. ........................ 257/412; 257/413; 257/585; 257/900
(58) Field of Classification Search ................ 257/412, 257/413, E29.127; 438/585, 900
See application file for complete search history.

(56) References Cited

U.S. PATENT DOCUMENTS

| 6,172,411 | B1 * | 1/2001 | Chao et al. | 257/639 |
| 6,255,698 | B1 * | 7/2001 | Gardner et al. | 257/369 |
| 6,744,084 | B2 * | 6/2004 | Fossum | 257/292 |

FOREIGN PATENT DOCUMENTS

JP 2000-91562 A 3/2000

* cited by examiner

*Primary Examiner*—Leonardo Andújar
(74) *Attorney, Agent, or Firm*—McDermott Will & Emery LLP

(57) ABSTRACT

A semiconductor device provided with a semiconductor silicon substrate and gate wiring provided on the semiconductor silicon substrate via a gate oxide film, where the gate wiring has a gate electrode, a gate wiring upper structure provided in contact with the gate electrode, and a side wall spacer, the side wall spacer is comprised of one kind or two or more kinds of inorganic compound insulating layers, and at least one kind of the inorganic compound insulating layer is comprised of silicon oxynitride with a nitrogen content ranging from 30 to 70%.

14 Claims, 14 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and method of manufacturing the semiconductor device, and more particularly, to a semiconductor device such that side wall spacers include silicon oxy nitride in a silicon oxide film gate type field effect transistor (hereinafter referred to as a "MOSFET transistor") and a method of manufacturing such a semiconductor device.

2. Related Art

FIG. 1 is a schematic cross-sectional view of principal part to illustrate a semiconductor device of conventional technique. Using a MOSFET transistor as an example, a semiconductor device 100 of conventional technique will be described below with reference to FIG. 1.

An element isolation insulating layer 2 and impurity diffusion layers 3 are provided in a surface region of a semiconductor silicon substrate 1. The impurity diffusion layers 3 correspond to the source and drain of the semiconductor device 100.

Gate electrodes 5 are provided via gate oxide films 4 on the semiconductor silicon substrate 1. A gate electrode upper structure 9 is provided on each of the gate electrodes 5.

Further, a first inorganic compound insulating layer 8 comprised of silicon nitride is provided in contact with side surfaces of the gate oxide film 4 and gate electrode 5, and a second inorganic compound insulating layer 6 comprised of silicon oxide is provided in contact with the inorganic compound insulating layer 8.

As shown in FIG. 1, the semiconductor device 100 has side wall spacers 600 each comprised of the first inorganic compound insulating layer 8 and second inorganic compound insulating layer 6, and the side wall spacer 600 has a lacking portion in an interface portion (hereinafter, referred to as a "substrate interface portion") of the semiconductor silicon substrate 1.

Further, an elevated source structure 701 and elevated drain structure 702 are provided in contact with the side wall spacer 600.

The elevated source structure 701 and elevated drain structure 702 are provided to fill the lacking portion of the substrate interface portion of the side wall spacer 600.

The lack of the substrate interface portion of the side wall spacer 600 is caused by an etching step and the like during the process of manufacturing the MOSFET transistor.

When such lack occurs, if the first organic compound insulating layer 8 does not exist, at least one of the elevated source structure 701 and elevated drain structure 702 may make electrical continuity with the gate electrode 5, becoming a cause of interference with the normal operation of the semiconductor device.

In order to avoid such continuity, it is proposed providing the semiconductor device 100 with the first inorganic compound insulating layer 8 comprised of silicon nitride in contact with both the side surface of the gate electrode 5 and the semiconductor silicon substrate 1 (JP 2000-91562).

BRIEF SUMMARY OF THE INVENTION

However, with reduction in size and weight and increases in degree of integration in recent year's electric/electrical devices, in semiconductor devices with such a structure that part of the side wall spacer 600 lacks in the substrate interface portion as in the semiconductor device 100, there have been problems of degrading the reliability of the semiconductor devices such as occurrence of the leak current in the gate oxide film, deterioration of anti-voltage characteristics of the gate oxide film and the like.

It is an object of the present invention to provide a semiconductor device with high reliability capable of suppressing both the occurrence of the leak current in the gate oxide film and deterioration of anti-voltage characteristics of the gate oxide film, and a method of manufacturing such a semiconductor device.

As a result of keen examination to solve the above-mentioned problems, the inventor of the present invention found that such a semiconductor device results in the solution of the problems that is provided with the side wall spacer including an inorganic compound insulating layer comprised of silicon oxy nitride composed of silicon, oxygen and nitrogen where a nitrogen content is in the range of 30 to 70% on a percentage basis of the number of nitrogen atoms to the sum of the numbers of oxygen atoms and nitrogen atoms, and reached completion of the present invention.

In other words, the present invention provides:

[1] a semiconductor device comprising:

a semiconductor silicon substrate;

an impurity diffusion layer provided in a surface region of the semiconductor silicon substrate;

an element isolation insulating layer provided in the surface region of the semiconductor silicon substrate; and gate wiring provided on the semiconductor silicon substrate via a gate oxide film, where the gate wiring has a gate electrode comprised of at least one selected from the group consisting of metal, metal silicide and polysilicon including impurities, a gate wiring upper structure comprised of silicon nitride provided in contact with the gate electrode, and a sidewall spacer provided in contact with both a side surface of the gate electrode and a side surface of the gate wiring upper structure, the side wall spacer is comprised of one kind or two or more kinds of inorganic compound insulating layers, and at least one kind of the inorganic compound insulating layer is comprised of silicon oxy nitride composed of silicon, oxygen and nitrogen in which a nitrogen content is in the range of 30 to 70% on a percentage basis of the number of nitrogen atoms to the sum of the numbers of oxygen atoms and nitrogen atoms.

Further, the invention provides:

[2] a semiconductor device as described in above-mentioned item [1], where the sidewall spacer is comprised of a first inorganic compound insulating layer comprised of silicon oxy nitride with the nitrogen content ranging from 30 to 70% provided in contact with the side surface of the gate electrode, the side surface of the gate wiring upper structure and the gate oxide film, and a second inorganic compound insulating layer comprised of silicon nitride provided in contact with the first inorganic compound insulating layer.

Furthermore, the invention provides:

[3] a semiconductor device as described in above-mentioned item [1], where the side wall spacer is comprised of a first inorganic compound insulating layer comprised of silicon oxy nitride with the nitrogen content ranging from 30 to 50% provided in contact with the side surface of the gate electrode, the side surface of the gate wiring upper structure and the gate oxide film, a second inorganic compound insulating layer comprised of silicon oxy nitride with the nitrogen content ranging from 50 to 70% provided in contact with the first inorganic compound insulating layer, and a third inorganic compound insulating layer comprised of silicon nitride provided in contact with the second inorganic compound insulating layer.

Furthermore, the invention provides:

[4] a semiconductor device as described in above-mentioned item [1], where the side wall spacer is comprised of silicon oxy nitride with the nitrogen content ranging from 30 to 70% provided in contact with the side surface of the gate electrode, the side surface of the gate wiring upper structure and the gate oxide film.

Furthermore, the invention provides:

[5] a semiconductor device as described in any one of above-mentioned items [1] to [4], where the nitrogen content relative to the silicon oxy nitride increases successively with reference to positions to come into contact with the side surface of the gate electrode, the side surface of the gate wiring upper structure and the gate oxide film.

Furthermore, the invention provides:

[6] a semiconductor device as described in any one of above-mentioned items [1] to [5], where the device further has at least one selected from the group consisting of an elevated source structure and an elevated drain structure provided in contact with the semiconductor silicon substrate in a predetermined position on the semiconductor silicon substrate.

Furthermore, the invention provides:

[7] a method of manufacturing a semiconductor device, having the steps of:

(1) forming an impurity diffusion layer and an element isolation insulating layer in a surface region of a semiconductor silicon substrate;

(2) forming a gate oxide film on the semiconductor silicon substrate; and (3) further forming on the gate oxide film gate wiring having a gate electrode comprised of at least one selected from the group consisting of metal, metal silicide and polysilicon including impurities, a gate wiring upper structure comprised of silicon nitride provided in contact with the gate electrode, and a side wall spacer provided in contact with both a side surface of the gate electrode and a side surface of the gate wiring upper structure, where the side wall spacer is formed of one kind or two or more kinds of inorganic compound insulating layers respectively comprised of one kind or two or more kinds of inorganic compounds, and at least one kind of the inorganic compound insulating layer is formed of silicon oxy nitride comprised of silicon, oxygen and nitrogen in which a nitrogen content is in the range of 30 to 70% on a percentage basis of the number of nitrogen atoms to the sum of the numbers of oxygen atoms and nitrogen atoms.

Furthermore, the invention provides:

[8] a method of manufacturing a semiconductor device as described in above-mentioned item [7], where the silicon oxy nitride is formed by low pressure CVD in an atmosphere of mixed gas comprised of dichlorosilane gas, ammonia gas and nitrogen monoxide gas in the temperature range of 650 to 750° C.

Furthermore, the invention provides:

[9] a method of manufacturing a semiconductor device as described in above-mentioned item [7] or [8], where the method further has the step (4) of wet etching as an essential step, and furthermore has at least one selected from the group consisting of:

the step (5) of forming at least one (hereinafter, referred to as an "elevated source/drain structure") selected from the group consisting of an elevated source structure and an elevated drain structure in a predetermined position on the semiconductor silicon substrate by a selective epitaxial method, and further forming a contact plug on the elevated source/drain structure, and the step (6) of forming a contact plug on the semiconductor silicon substrate.

Furthermore, the invention provides:

[10] a method of manufacturing a semiconductor device as described in above-mentioned item [9], where the step (4) of wet etching is carried out using a hydrofluoric acid containing solution.

Furthermore, the invention provides:

[11] a method of manufacturing a semiconductor device as described in above-mentioned item [9] or [10], where at least one kind of the inorganic compound insulating layer constituting the side wall spacer is formed using silicon oxy nitride with the nitrogen content ranging from 50 to 70%, and the step (4) of wet etching is carried out using a dilute hydrofluoric acid aqueous solution.

Still furthermore, the invention provides:

[12] a method of manufacturing a semiconductor device as described in above-mentioned item [9] or [10], where at least one kind of the inorganic compound insulating layer constituting the side wall spacer is formed using silicon oxy nitride with the nitrogen content ranging from 30 to 50%, and the step (4) of wet etching is carried out using a buffer containing dilute hydrofluoric acid aqueous solution.

According to the present invention, it is possible to provide a semiconductor device with high reliability capable of suppressing both the occurrence of the leak current in the gate oxide film and deterioration of anti-voltage characteristics of the gate oxide film, and a method of manufacturing such a semiconductor device.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which.

DETAILED DESCRIPTION OF THE INVENTION

Preferred embodiments of the present invention will be described below with reference to accompanying drawings.

Figure 1:
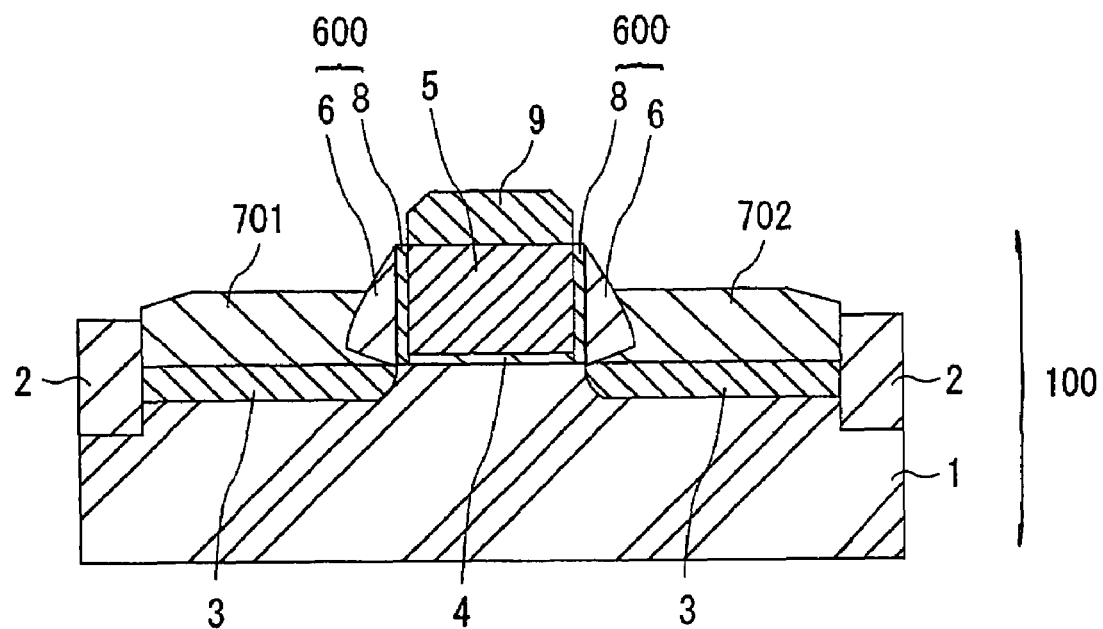
FIG. 1 is a schematic cross-sectional view of principal part to illustrate a conventional MOSFET transistor.
Figure 2:
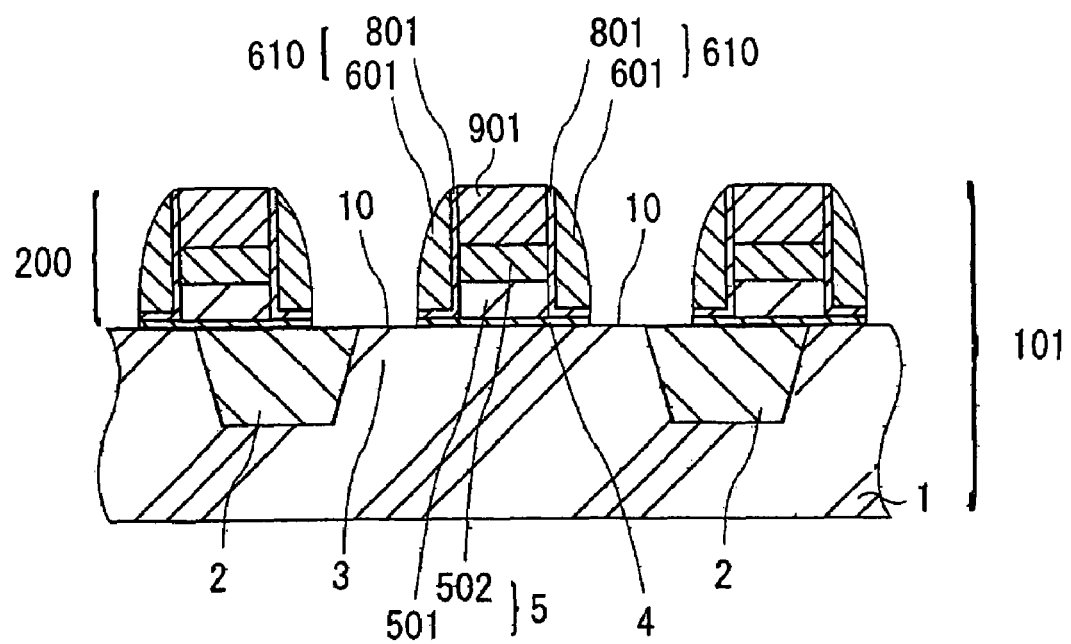
FIG. 2 is a schematic cross-sectional view of principal part illustrating an embodiment of a semiconductor device of the present invention.

FIG. 2 is a schematic cross-sectional view of principal part illustrating a first embodiment of a semiconductor device of the present invention.

A semiconductor device 101 in FIG. 2 is provided with a semiconductor silicon substrate 1. The semiconductor silicon substrate for use in the invention is not limited particularly, and any semiconductor silicon substrates generally used in the semiconductor device can be used.

Such semiconductor silicon substrates are well-known, and for example, silicon wafers including p-type impurities are commercially available.

The semiconductor device 101 of the invention has an impurity diffusion layer (not shown) provided in a surface region of the semiconductor silicon substrate 1.

Such an impurity diffusion layer can be provided typically by introducing p-type impurities such as boron or the like or n-type impurities such as phosphorus or the like into a surface region of the semiconductor silicon substrate 1 by ion implantation or the like, and then performing annealing processing with heat.

In the case of the semiconductor device 101 of the invention, source regions and drain regions 3 corresponding to gate electrodes of gate wiring 200 in FIG. 2 are provided by a well-known method.

The semiconductor device 101 of the invention has an element isolation insulating layer 2 provided in the surface region of the semiconductor silicon substrate.

A method of forming the element isolation insulating layer 2 is not limited particularly. For example, the element isolation insulating layer 2 comprised of silicon oxide and the like can be formed by performing high-density plasma CVD or the like using the semiconductor silicon substrate 1.

The semiconductor device 101 of the invention further has the gate wiring 200 provided on the semiconductor silicon substrate 1 via a gate oxide film 4.

The gate oxide film 4 is typically comprised of silicon oxide. For example, such a gate oxide film 4 can be formed by reacting silicon 10 on the surface of the semiconductor silicon substrate, water, oxygen and the like under high temperatures.

The gate wiring 200 has gate electrodes 5 each comprised of one, or two or more of metal, metal silicide, polysilicon including impurities and the like, gate wiring upper structures 901 comprised of silicon nitride provided in contact with the gate electrodes 5, and side wall spacers 610 each provided in contact with both a side surface of the gate electrode 5 and a side surface of the gate wiring upper structure 901.

Alternately, a gate wiring upper structure 901 comprised of silicon oxy nitride and the like is substituted for the structure 901 comprised of silicon nitride.

As shown in FIG. 2, the gate electrode 5 is comprised of polysilicon 501 containing impurities and metal 502 such as tungsten or the like.

Examples of the impurities contained in the polysilicon 501 are p-type impurities such as boron or the like and n-type impurities such as phosphorus or the like.

The side wall spacer is comprised of one kind or two or more kinds of inorganic compound insulating layers.

As such a side wall spacer 610, for example, as in the case of the semiconductor device 101, the spacer may be comprised of a first inorganic compound insulating layer 801 composed of silicon oxy nitride provided in contact with the upper surface of the gate oxide film 4, the side surface of the gate electrode 5 and the side surface of the gate wiring upper structure 901, and a second inorganic compound insulating layer 601 comprised of silicon nitride provided in contact with the first inorganic compound insulating layer 801.

Further, the first inorganic compound insulating layer 801 comprised of silicon oxy nitride for use in the invention needs to have a nitrogen content ranging from 30 to 70%.

When the nitrogen content is less than 30% or exceeds 70%, the reliability of the obtained semiconductor device deteriorates such that the leak current occurs in the gate oxide film of the semiconductor device, anti-voltage characteristics of the gate oxide film degrade, and the like.

Figure 3:
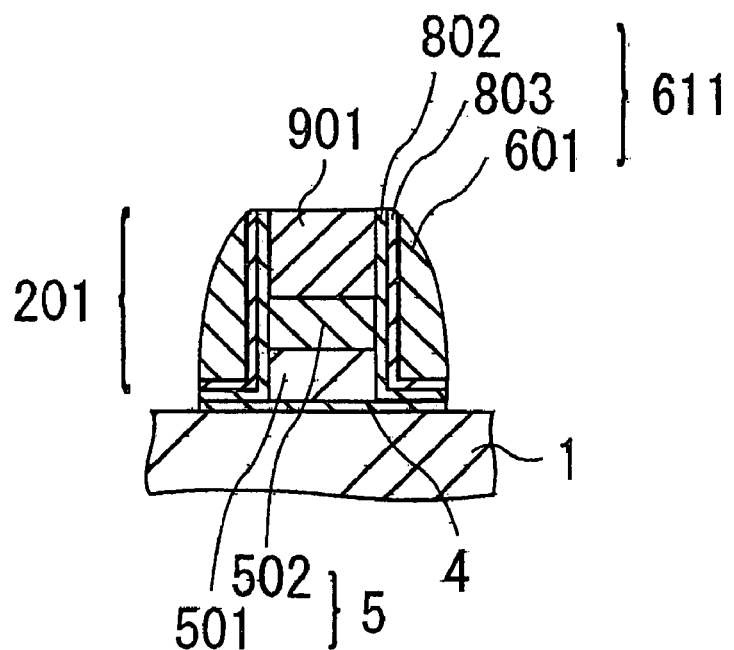
FIG. 3 is a schematic cross-sectional view of principal part illustrating a portion of gate wiring 201 in another embodiment of the semiconductor device of the invention.

FIG. 3 is a schematic cross-sectional view of principal part illustrating a portion of gate wiring 201 in a second embodiment of the semiconductor device of the invention.

In addition, the structure of the semiconductor device of FIG. 3 is the same as in the semiconductor device 101 illustrated in FIG. 2 except a side wall spacer 611.

The side wall spacer 611 of the gate wiring 201 is comprised of a first inorganic compound insulating layer 802 comprised of silicon oxy nitride with the nitrogen content ranging from 30 to 50% provided in contact with the upper surface of the gate oxide film 4, the side surface of the gate electrode 5, and the side surface of the gate wiring upper structure 901, a second inorganic compound insulating layer 803 comprised of silicon oxy nitride with the nitrogen content ranging from 50 to 70% provided in contact with the first inorganic compound insulating layer 802, and a third inorganic compound insulating layer 601 comprised of silicon nitride provided in contact with the second inorganic compound insulating layer 803.

Figure 4:
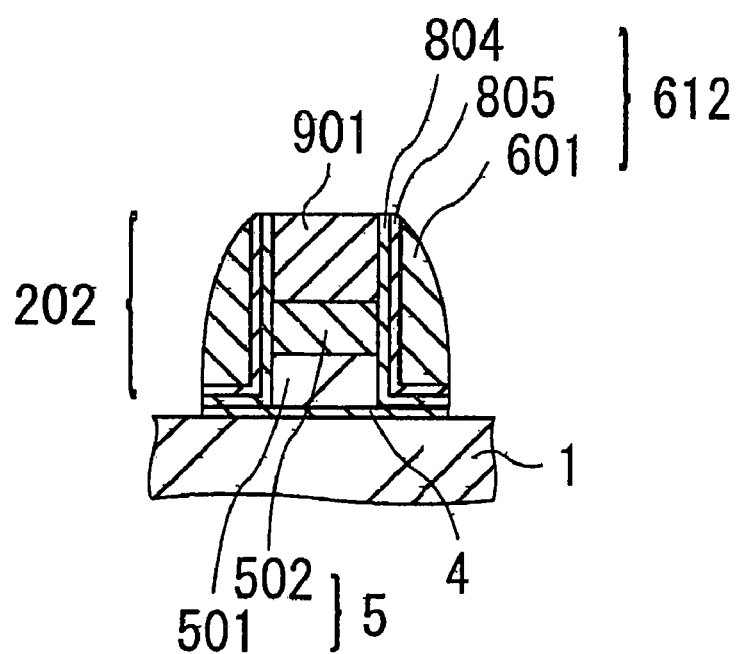
FIG. 4 is a schematic cross-sectional view of principal part illustrating a portion of gate wiring 202 in another embodiment of the semiconductor device of the invention.

FIG. 4 is a schematic cross-sectional view of principal part illustrating a portion of gate wiring 202 in a third embodiment of the semiconductor device of the invention.

In addition, the structure of the semiconductor device of FIG. 4 is the same as in the semiconductor device 101 illustrated in FIG. 2 except a side wall spacer 612.

The third embodiment of the semiconductor device in FIG. 4 is almost the same as the second embodiment of the semiconductor device in FIG. 3, and differs from the second embodiment in that the content of nitrogen contained in both the first inorganic compound insulating layer 802 and the second inorganic compound insulating layer 803 as shown in FIG. 3 changes successively in the case of the side wall spacer 612 in FIG. 4.

The nitrogen content in silicon oxy nitride of both the first inorganic compound insulating layer 804 and the second inorganic compound insulating layer 805 in FIG. 4 increases successively with reference to positions to come into contact with the side surface of the gate electrode, the side surface of the gate wiring upper structure and the gate oxide film.

Figure 5:
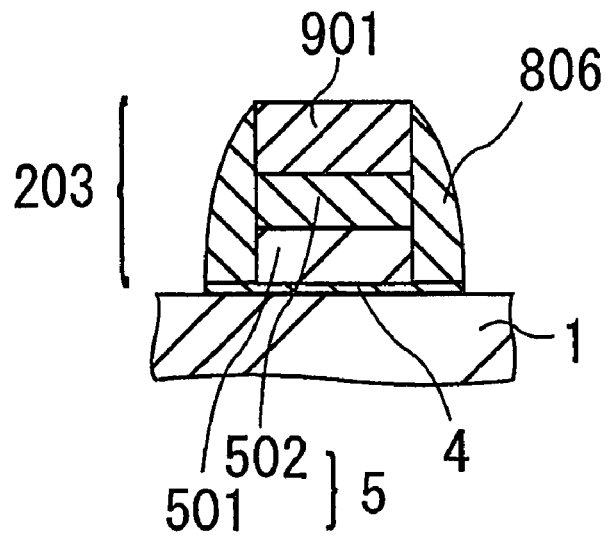
FIG. 5 is a schematic cross-sectional view of principal part illustrating a portion of gate wiring 203 in another embodiment of the semiconductor device of the invention.

FIG. 5 is a schematic cross-sectional view of principal part illustrating a portion of gate wiring 203 in a fourth embodiment of the semiconductor device of the invention.

In addition, the structure of the semiconductor device of FIG. 5 is the same as in the semiconductor device 101 illustrated in FIG. 2 except a side wall spacer 806.

The fourth embodiment of the semiconductor device in FIG. 5 is almost the same as the first embodiment of the semiconductor device 101 in FIG. 2, and differs from the first embodiment in that the side wall spacer 806 in FIG. 5 substitutes the first inorganic compound insulating layer 801 for the second inorganic compound insulating layer 601 of the side wall spacer 610 in FIG. 2.

In other words, the side wall spacer 806 in the fourth embodiment in FIG. 5 is comprised of silicon oxy nitride 806 with the nitrogen content ranging from 30 to 70% provided in contact with the side surface of the gate electrode 5, the side surface of the gate wiring upper structure 901 and the gate oxide film 4.

The nitrogen content in the silicon oxy nitride can be adjusted to increase successively with reference to positions to come into contact with the side surface of the gate electrode, the side surface of the gate wiring upper structure and the gate oxide film.

Further, as well as the structure as described above, the semiconductor device of the invention may have at least one (hereinafter, referred to as an "elevated source/drain structure") selected from the group consisting of an elevated source structure and an elevated drain structure in a predetermined position on the semiconductor silicon substrate 1.

Figure 6:
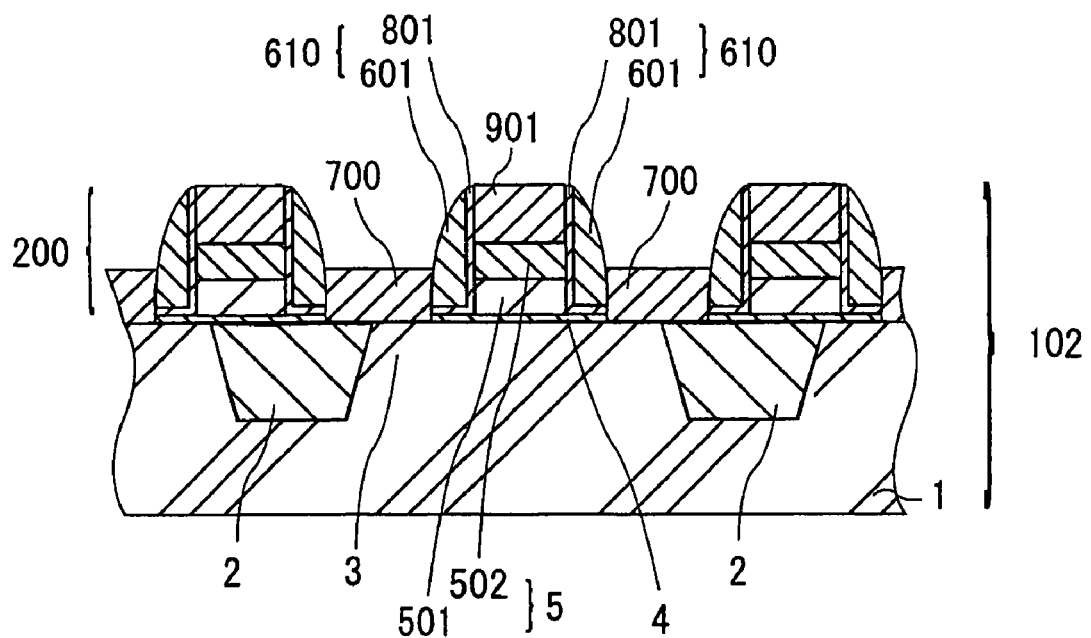
FIG. 6 is a schematic cross-sectional view of principal part illustrating the semiconductor device of the invention provided with elevated source/drain structures.

FIG. 6 is a schematic cross-sectional view of principal part illustrating the semiconductor device 102 of the invention provided with the elevated source/drain structures.

FIG. 6 illustrates elevated source/drain structures 700 each provided in contact with both the surface of the semiconductor silicon substrate 1 and gate wiring 200 of the semiconductor device 101 shown in FIG. 2.

In addition, the elevated source/drain structure can be provided also in the case of semiconductor device of any one of the second to fourth embodiments of the invention as shown in FIGS. 3 to 5, not shown particularly.

The semiconductor device thus obtained is suitable for use in DRAM and the like provided with the MOSFET transistor structure, for example.

The semiconductor device of the invention and a method of manufacturing the semiconductor device will be described below more specifically with reference to Examples. In addition, the subject matter of the invention is not limited to the Examples described below.

EXAMPLE 1

A first embodiment of a manufacturing apparatus of the invention will first be described with reference to drawings.

Figure 7:
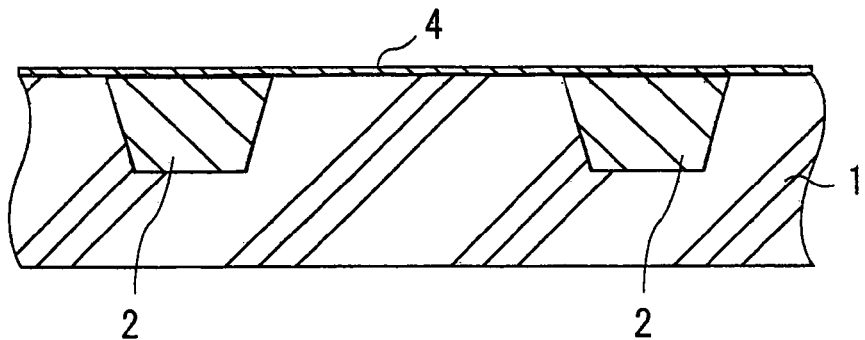
FIG. 7 is a schematic cross-sectional view of principal part to explain the step of forming an impurity diffusion layer and element isolation insulating layer in a surface region of a semiconductor silicon substrate, and the step of forming a gate oxide film on the semiconductor silicon substrate.

FIG. 7 is a schematic cross-sectional view of principal part to explain the step of forming an impurity diffusion layer (not shown) and element isolation insulating layer 2 in a surface region of the semiconductor silicon substrate 1, and the step of forming the gate oxide film 4 on the semiconductor silicon substrate 1.

In addition, in the invention was used the semiconductor silicon substrate 1 beforehand including p-type impurities.

First, the element isolation insulating layer 2 comprised of silicon oxide was formed on the semiconductor silicon substrate 1 by high-density plasma CVD.

The impurity diffusion layer (not shown) was formed by ion plantation of n-type impurity using the gate wiring 200 as a protection mask after forming the gate wiring 200 described later. The impurity diffusion layer corresponds to the source and drain corresponding to the gate wiring 200.

In addition, the method of forming the impurity diffusion layer is well-known, and the structure of the impurity diffusion layer can be determined as appropriate corresponding to the function and the like of a semiconductor device.

Next, the gate oxide film 4 was formed on the surface of the semiconductor silicon substrate 1 by reacting silicon on the surface of the semiconductor silicon substrate 1 and water vapor at high temperatures. The thickness of the gate oxide film 4 was in the range of 4 to 7 nm.

Figure 8:
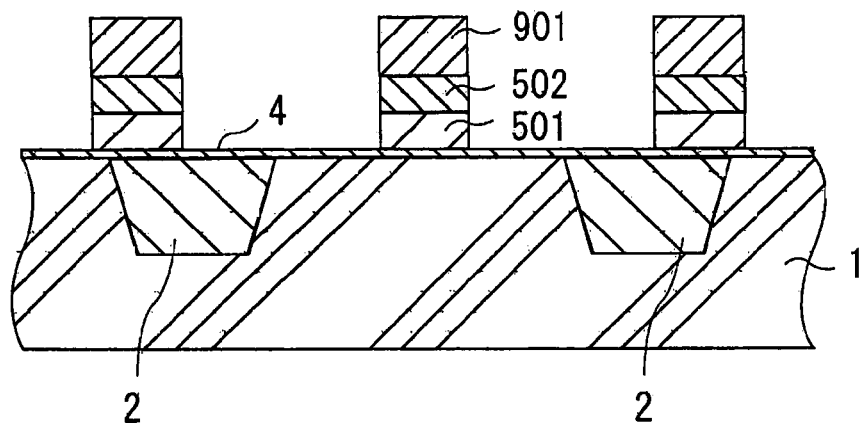
FIG. 8 is a schematic cross-sectional view of principal part to explain the step of forming gate electrodes and gate wiring upper structures on the gate oxide film.

FIG. 8 is a schematic cross-sectional view of principal part to explain the step of forming gate electrodes comprised of polysilicon 501 including n-type impurities and tungsten 502 and gate wiring upper structures 901 comprised of silicon nitride provided in contact with the gate electrodes on the gate oxide film 4.

The layer 501 comprised of polysilicon including n-type impurities and layer 502 comprised of tungsten were formed on the gate oxide film 4 by CVD, sputtering and the like. Then, the layer 901 comprised of silicon nitride was formed on the layer 502 comprised of tungsten.

Subsequently, using a resist as a protection mask (not shown), layers in predetermined positions were removed from the layer 501 comprised of polysilicon including n-type impurities, the layer 502 comprised of tungsten, and the layer 901 comprised of silicon nitride by well-known etching operation, and then, by removing the resist, the structure as shown in FIG. 8 was obtained.

Figure 9:
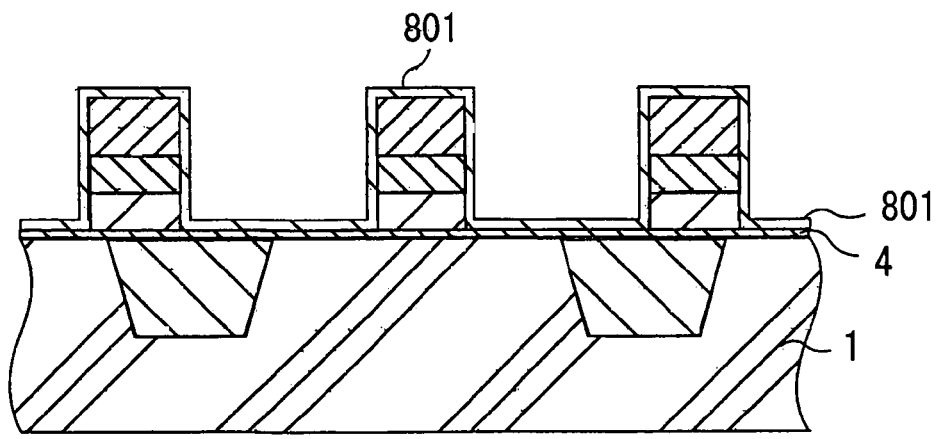
FIG. 9 is a schematic cross-sectional view of principal part to explain the step of forming a first inorganic compound insulating layer to form a side wall spacer.

FIG. 9 is a schematic cross-sectional view of principal part to explain the step of forming the first inorganic compound insulating layer 801 to form the side wall spacer.

As shown in FIG. 9, the first inorganic compound insulating layer 801 comprised of silicon oxy nitride with the nitrogen content of 31.5% was formed on the side surfaces of the gate electrodes comprised of the polysilicon 501 including n-type impurities and tungsten 502, on the side surfaces and upper surfaces of the gate wiring upper structures 901 comprised of silicon nitride and on the upper surface of the gate oxide film 4 as shown in FIG. 8.

In forming the first inorganic compound insulating layer 801, the pressure inside a silicon oxy nitride forming furnace was reduced to 1.51 Torr, and the concentration of oxygen inside the forming furnace was set at 10 ppm or less.

Then, the nitrogen gas with a flow rate of 250 ml/minute, nitrogen monoxide ($N_2O$) gas with a flow rate of 800 ml/minute, ammonia ($NH_3$) gas with a flow rate of 10 ml/minute, and dichlorosilane (DCS) gas with a flow rate of 75 ml/minute were introduced into the forming furnace in this order to perform low pressure CVD.

Then, the supply of the DCS gas, $NH_3$ gas and $N_2O$ gas was stopped in this order to finish the low pressure CVD. At this point, the thickness of the first inorganic compound insulating layer 801 was in the range of 5 to 10 nm.

The temperature inside the forming furnace was 680° C. when the low pressure CVD was carried out.

The nitrogen content of the silicon oxy nitride can be adjusted to a desired value by adjusting flow rates of the DCS gas, $NH_3$ gas and $N_2O$ gas within the temperature range of 650 to 750° C.

For example, by varying the flow rates of the DCS gas, $NH_3$ gas and $N_2O$ gas as appropriate to beforehand examine the nitrogen contents of generated silicon oxy nitrides, it is possible to form a silicon oxy nitride with the nitrogen content adjusted to a desired value according to the knowledge.

Next, after sufficiently replacing the atmosphere inside the forming furnace with the nitrogen gas, the pressure was restored to the normal pressure in an atmosphere of nitrogen, and the wafer with the silicon oxy nitride formed thereon was removed.

In the silicon oxy nitride at this point, the growth rate was 0.15 nm/minute, the refractive index was 1.63, and the nitrogen content was 31.5%.

Figure 10:
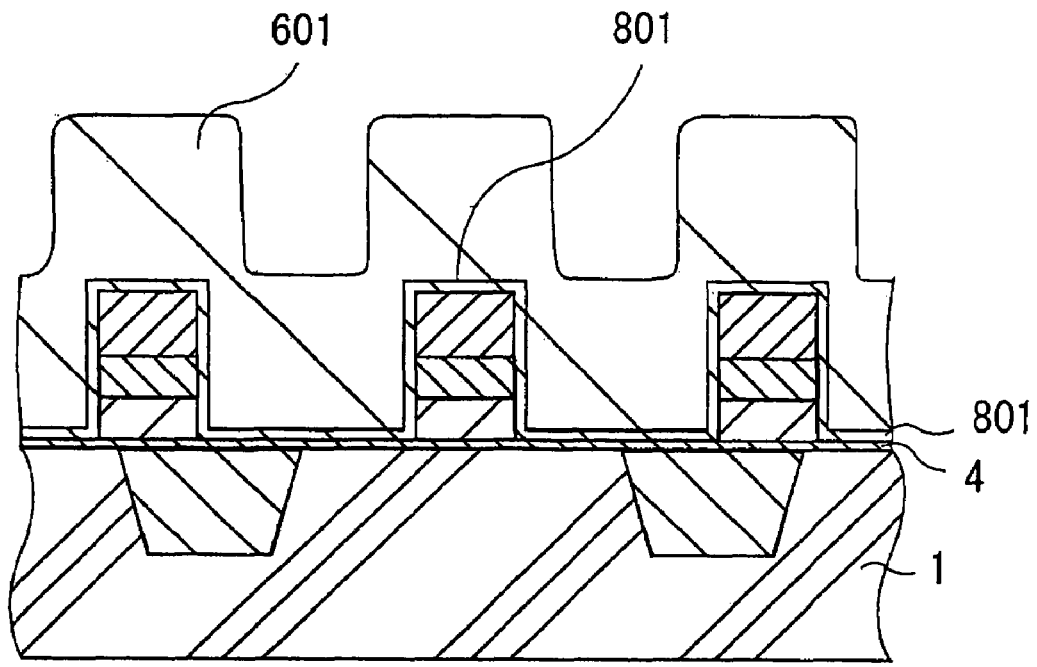
FIG. 10 is a schematic cross-sectional view of principal part to explain the step of forming a silicon nitride layer on the wafer with silicon oxy nitride formed thereon.

FIG. 10 is a schematic cross-sectional view of principal part to explain the step of forming the silicon nitride layer 601 on the wafer with the silicon oxy nitride formed thereon.

The wafer with the silicon oxy nitride formed thereon was placed in a silicon nitride forming furnace, and the silicon nitride layer 601 was provided on the wafer with the silicon oxy nitride formed thereon by CVD.

In addition, the silicon nitride layer can also be formed using the silicon oxy nitride forming furnace, which is the same as in following Examples.

Then, by performing anisotropic etching on the silicon nitride layer 601, it is possible to obtain the structure including the gate wiring 200 having the side wall spacers 610 as shown in FIG. 2. The width of the side wall spacer 610 was in the range of 15 to 25 nm at the maximum from the side surface of the gate electrode 5.

In addition, the stress was 0.45 Gpa which was imposed on the semiconductor silicon substrate 1 due to formation of the side wall spacers.

Further, it is possible to remove silicon oxide existing on the surface 10 of the semiconductor silicon substrate 1 by hydrofluoric acid containing solution.

Examples of the hydrofluoric acid containing solution include buffer containing hydrofluoric acid aqueous solution (buffered hydrofluoric acid, hereinafter, abbreviated as "BHF") and dilute hydrofluoric acid aqueous solution (hereinafter, abbreviated as "DHF").

In this Example, the wet etching operation was performed using BHF to remove silicon oxide existing on the surface 10 of the semiconductor silicon substrate 1.

When the nitrogen content of the silicon oxy nitride is within the range of 30 to 50%, etching rates of BHF are almost the same on the silicon oxy nitride and gate oxide film 4. Therefore, the lack hardly occurred in the substrate interface portion of the side wall spacer 610.

Subsequently, by the selective epitaxial growth method, the elevated source/drain structures 700 were formed as shown in FIG. 6.

By the above-mentioned steps, it is possible to manufacture a semiconductor device with the structure as shown in FIG. 2, and further, a semiconductor device with the structure as shown in FIG. 6.

EXAMPLE 2

A semiconductor device with the structure as shown in FIG. 2 was manufactured in the same way as in Example 1 except that low pressure CVD was performed on conditions that the pressure inside the silicon oxy nitride forming furnace was 1.1 Torr, and that the $N_2O$ gas with a flow rate of 400 ml/minute, $NH_3$ gas with a flow rate of 100 ml/minute, and DCS gas with a flow rate of 75 ml/minute were introduced into the forming furnace in this order.

Further, silicon oxide existing on the surface 10 of the semiconductor silicon substrate 1 as shown in FIG. 2 was removed by performing the wet etching operation using DHF.

When the content of silicon nitride contained in the silicon oxy nitride is within the range of 50 to 70%, etching rates of DHF are almost the same on the silicon oxy nitride and gate oxide film 4. Therefore, a lacking portion hardly occurred under the side wall spacer.

Subsequently, by the selective epitaxial growth method, the semiconductor device with the elevated source/drain structures 700 was formed as shown in FIG. 6.

Results are shown in Table 1.

EXAMPLE 3

A semiconductor device with the structure as shown in FIG. 2 was manufactured in the same way as in Example 1 except that low pressure CVD was performed on conditions that the pressure inside the silicon oxy nitride forming furnace was 1 Torr, and that the $N_2O$ gas with a flow rate of 400 ml/minute, $NH_3$ gas with a flow rate of 25 ml/minute, and DCS gas with a flow rate of 75 ml/minute were introduced into the forming furnace in this order.

Further, silicon oxide existing on the surface 10 of the semiconductor silicon substrate 1 as shown in FIG. 2 was removed by performing the wet etching operation using DHF.

When the nitrogen content of the silicon oxy nitride is within the range of 50 to 70%, etching rates of DHF are almost the same on the silicon oxy nitride and gate oxide film 4. Therefore, a lacking portion hardly occurred under the side wall spacer.

Subsequently, by the selective epitaxial growth method, the semiconductor device with the elevated source/drain structures 700 was formed as shown in FIG. 6. Results are shown in Table 1.

EXAMPLE 4

Figure 11:
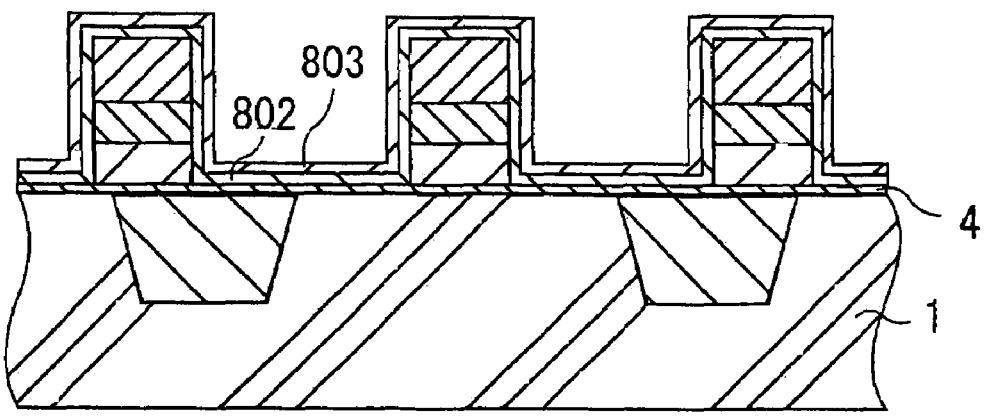
FIG. 11 is a schematic cross-sectional view of principal part to explain the step of forming a first inorganic compound insulating layer and a second inorganic compound insulating layer on the wafer with silicon oxy nitride formed thereon.

As in the case of Example 1, replacing the operation of forming the first inorganic compound insulating layer 801 comprised of the silicon oxy nitride as shown in FIG. 9, as shown in FIG. 11, a first inorganic compound insulating layer 802 comprised of silicon oxy nitride with the nitrogen content ranging from 30 to 50% was first formed, and then, a second inorganic compound insulating layer 803 comprised of silicon oxy nitride with the nitrogen content ranging from 50 to 70% was formed on the first inorganic compound insulating layer 802.

Figure 12:
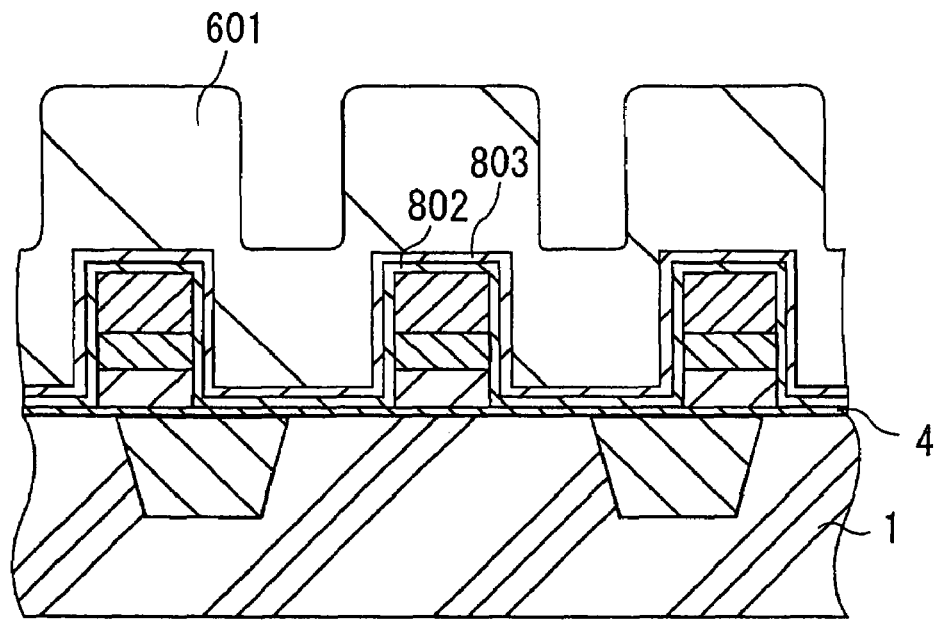
FIG. 12 is a schematic cross-sectional view of principal part to explain the step of forming a silicon nitride layer on the wafer with the first inorganic compound insulating layer and second inorganic compound insulating layer formed thereon.

Herein, FIG. 12 is a schematic cross-sectional view of principal part to explain the step of forming a silicon nitride layer on the wafer with the first inorganic compound insulating layer 802 and second inorganic compound insulating layer 803 formed thereon.

The silicon nitride layer 601 can be provided on the wafer with the first inorganic compound insulating layer 802 and second inorganic compound insulating layer 803 formed thereon, as shown in FIG. 12, by placing the wafer with the first inorganic compound insulating layer 802 and second inorganic compound insulating layer 803 formed thereon in the silicon nitride forming furnace and performing CVD.

Figure 13:
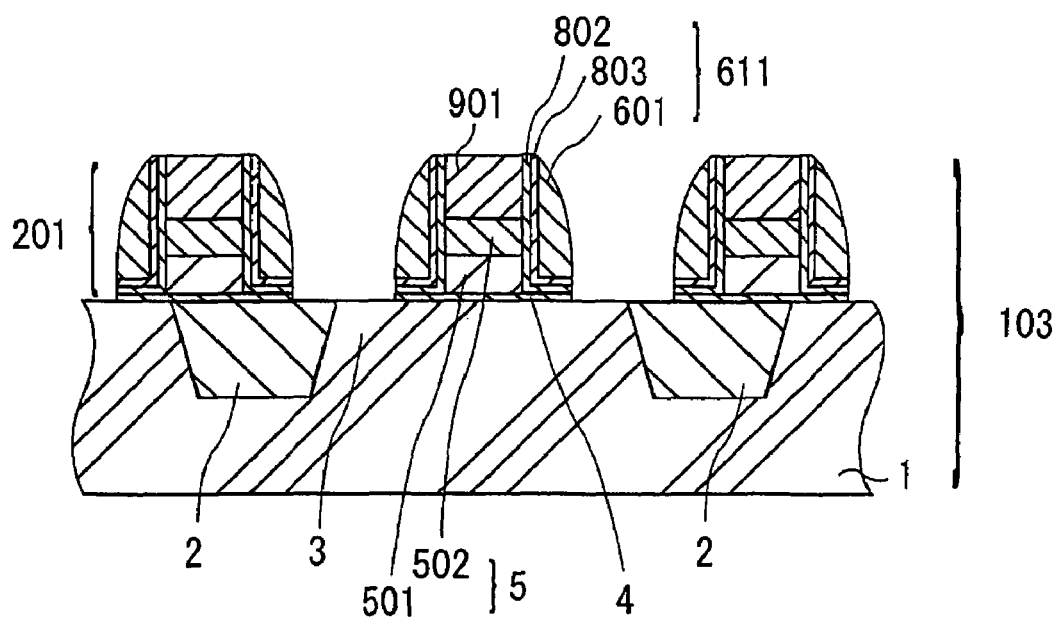
FIG. 13 is a schematic cross-sectional view of principal part illustrating another embodiment of a semiconductor device of the invention.

Then, by performing anisotropic etching on the silicon nitride layer 601, it is possible to obtain a semiconductor device 103 having the structure including the gate wiring 201 having the side wall spacer 611 as shown in FIG. 13.

Figure 14:
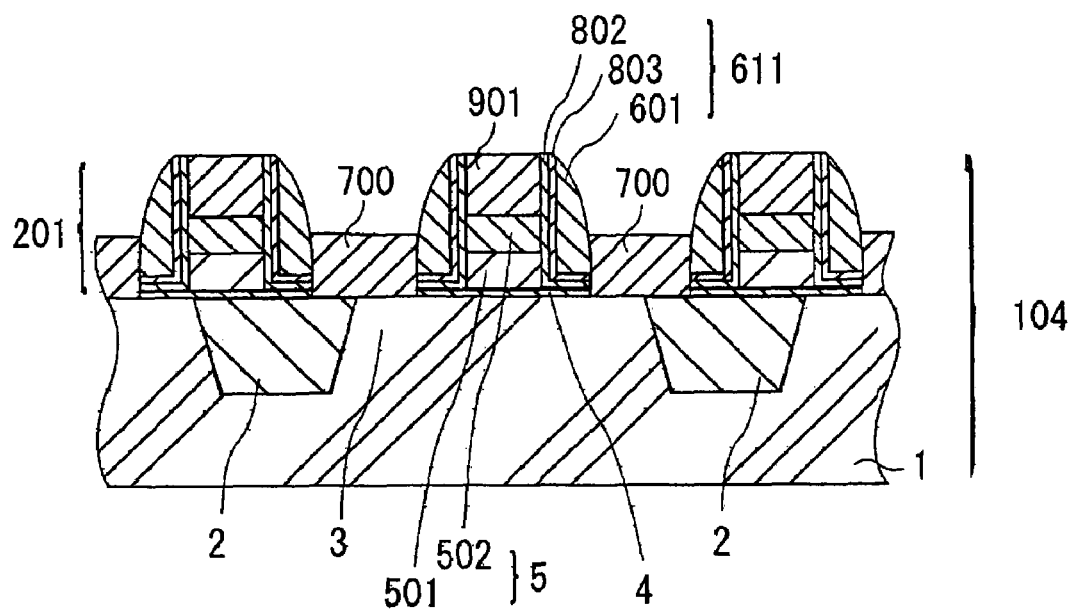
FIG. 14 is a schematic cross-sectional view of principal part illustrating the semiconductor device of the invention provided with the elevated source/drain structures.

Subsequently, by the selective epitaxial growth method, it is possible to manufacture a semiconductor device 104 having the elevated source/drain structures 700 as shown in FIG. 14.

In the semiconductor device 104, in the substrate interface portion of the side wall spacer 611, the nitrogen content increases successively in the gate oxide layer 4 comprised of silicon oxide, the first inorganic compound insulating layer 802 with the low nitrogen content, and the second inorganic compound insulating layer 803 with the high nitrogen content, in this order. Therefore, the elevated source/drain structure 700 as shown in FIG. 14 has a feature that the crystal defect of silicon occurs more hardly therein than in cases of Examples 1 to 3.

EXAMPLE 5

Figure 15:
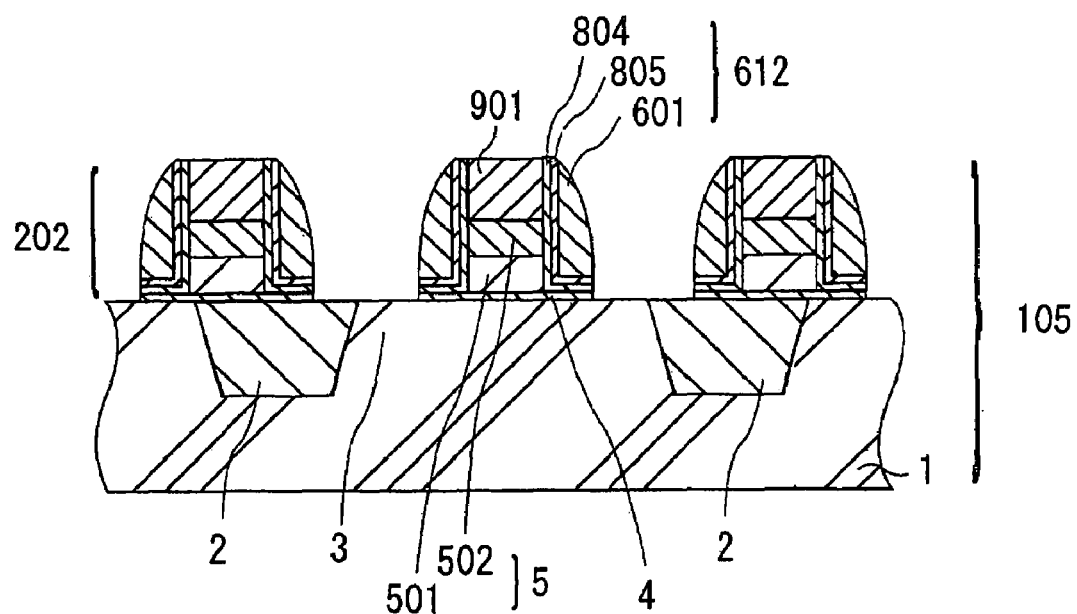
FIG. 15 is a schematic cross-sectional view of principal part illustrating another embodiment of the semiconductor device of the invention.

As in the case of Example 4, by sequentially varying the flow rates of the DCS gas, $NH_3$ gas and $N_2O$ gas in forming the first inorganic compound insulating layer and the second inorganic compound insulating layer, the nitrogen content is adjusted to vary successively in silicon oxy nitride of the first inorganic compound insulating layer 804 and the second inorganic compound insulating layer 805 as shown in FIG. 15, and it is possible to obtain a semiconductor device 105 with the structure as shown in FIG. 15.

Figure 16:
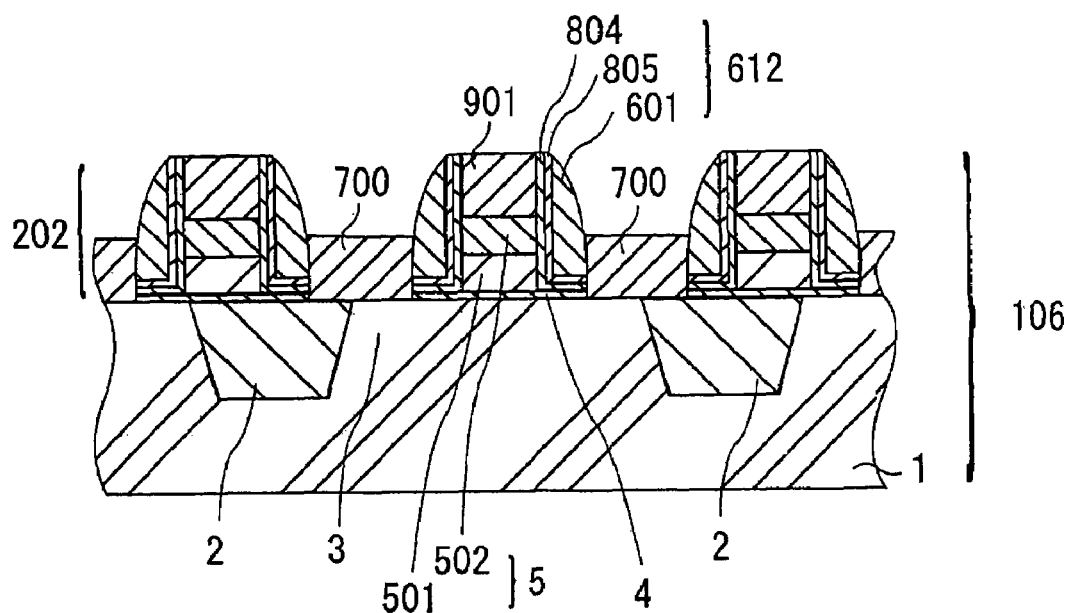
FIG. 16 is a schematic cross-sectional view of principal part illustrating the semiconductor device of the invention provided with the elevated source/drain structures.

Subsequently, by the selective epitaxial growth method, it is possible to manufacture a semiconductor device 106 having the elevated source/drain structures 700 as shown in FIG. 16.

In the semiconductor device, under the side wall spacer, the nitrogen content increases successively in the gate oxide layer 4 comprised of silicon oxide, the first inorganic compound insulating layer 804 with the low nitrogen content, and the second inorganic compound insulating layer 805 with the high nitrogen content, in this order. Therefore, the elevated source/drain structure 700 as shown in FIG. 16 has a feature that the crystal defect of silicon occurs more hardly therein than in cases of Examples 1 to 4.

EXAMPLE 6

Figure 17:
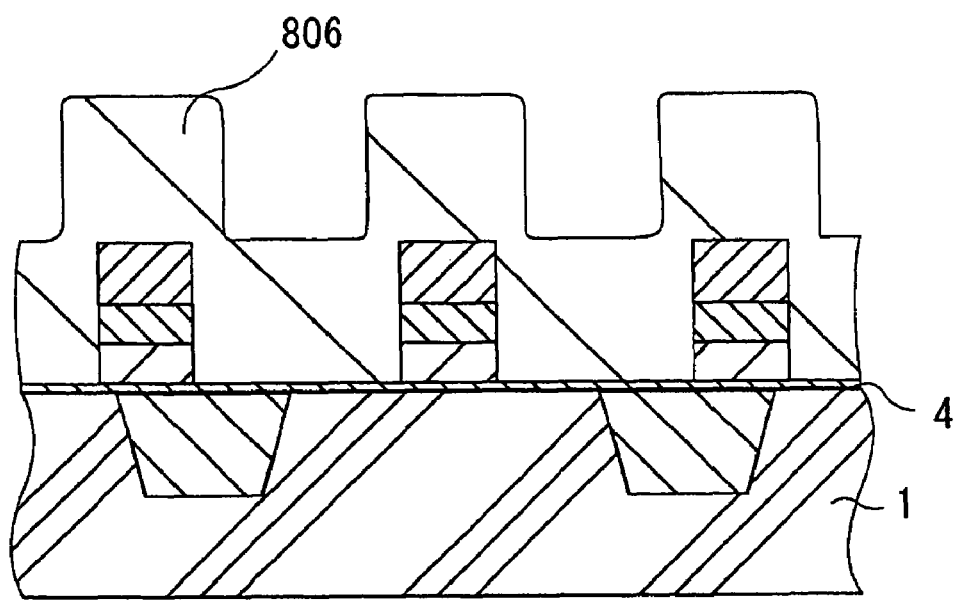
FIG. 17 is a schematic cross-sectional view of principal part to explain the step of forming a silicon oxy nitride layer to form a side wall spacer.

As in the case of Example 1, a layer 806 comprised of silicon oxy nitride with the nitrogen content ranging from 30 to 70% was formed, as shown in FIG. 17, on the side surfaces of the gate electrodes comprised of the polysilicon 501 including n-type impurities and tungsten 502 in FIG. 8, the side surfaces and upper surfaces of the gate wiring upper structures comprised of silicon nitride and the upper surface of the gate oxide film 4.

Figure 18:
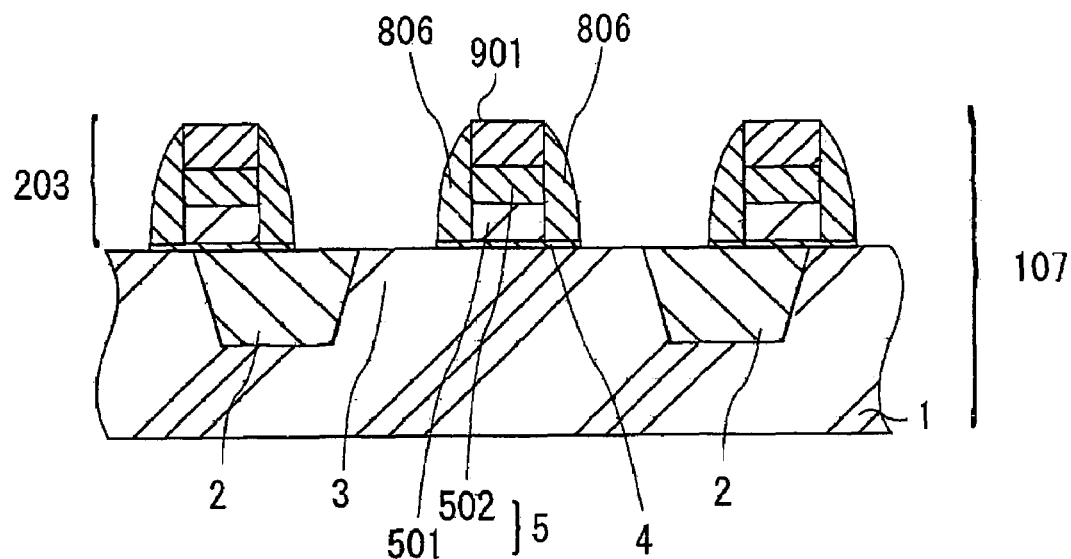
FIG. 18 is a schematic cross-sectional view of principal part illustrating another embodiment of the semiconductor device of the invention.

Then, by performing anisotropic etching, it is possible to obtain a semiconductor device 107 having the structure as shown in FIG. 18.

The nitrogen content of the layer comprised of the silicon oxy nitride is in the range of 30 to 50% in performing wet etching using the BHF to remove silicon oxide on the semiconductor silicon substrate, and in the range of 50 to 70% in performing wet etching using the DHF.

Figure 19:
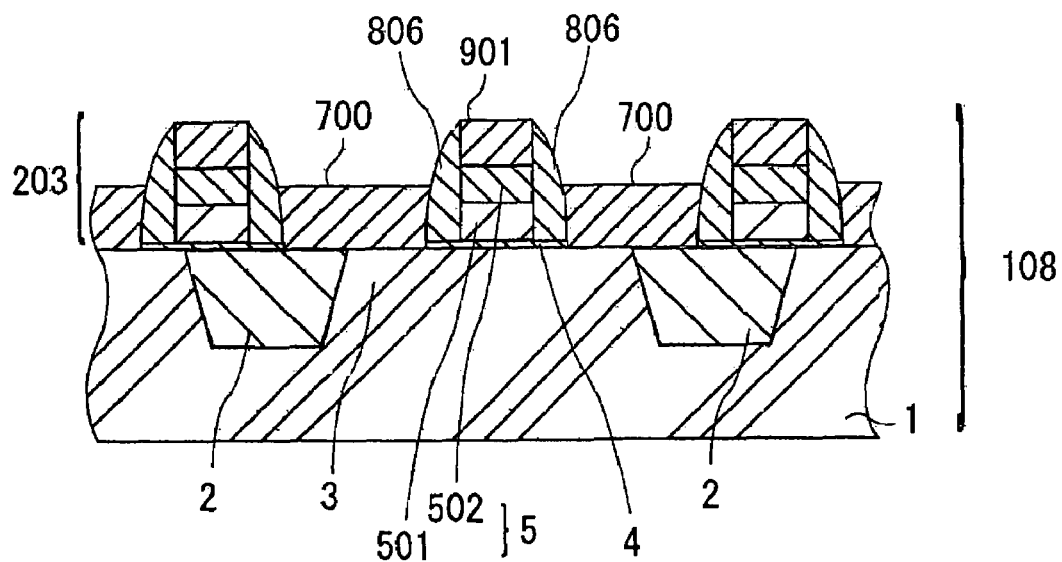
FIG. 19 is a schematic cross-sectional view of principal part illustrating the semiconductor device of the invention provided with the elevated source/drain structures.

Subsequently, by the selective epitaxial growth method, it is possible to manufacture a semiconductor device having the elevated source/drain structures 700 as shown in FIG. 19.

In the semiconductor device thus obtained, a lacking portion does not occur at all in the substrate interface portion of the side wall spacer in the semiconductor device.

TABLE 1

| Conditions of low pressure CVD | | Example 1 | Example 2 | Example 3 | Comparative Example 1 |
|---|---|---|---|---|---|
| Pressure | Torr | 1.51 | 1.1 | 1 | 0.7 |
| Flow rate of DCS | ml/min. | 75 | 75 | 75 | 75 |
| Flow rate of $NH_3$ | ml/min. | 10 | 100 | 25 | 100 |
| Flow rate of $N_2O$ | ml/min. | 800 | 400 | 400 | 100 |
| Flow rate of $N_2$ | ml/min. | 250 | 250 | 250 | 250 |
| Properties | | | | | |
| Growth speed | nm/min. | 0.15 | 0.27 | 0.14 | 0.36 |
| Refractive index | 633 nm | 1.63 | 1.83 | 1.75 | 1.92 |
| SiN ratio | % | 31.5 | 68.5 | 53.7 | 85.2 |
| Stress | Gpa | 0.45 | 0.95 | 0.79 | 1.1 |
| DHF etching rate | | 2.62 | 0.95 | 1.32 | 0.69 |
| BHF etching rate | | 1.28 | 0.51 | 0.91 | 0.35 |

In addition, each item in Table 1 indicates following descriptions:

Growth speed: Growth rate of silicon oxy nitride by low pressure CVD

Refractive index: value measured by light of 633 nm

SiN ratio: the nitrogen content (%) of the silicon oxy nitride measured by X-ray Photoelectron Spectroscopy (XPS)

Stress: stress imposed on the semiconductor silicon substrate by the side wall spacer DHF etching rate: rate of the wet etching speed of DHF on the silicon oxy nitride relative to the wet etching speed of DHF on the gate oxide film assumed as "1"

BHF etching rate: rate of the wet etching speed of BHF on the silicon oxy nitride relative to the wet etching speed of BHF on the gate oxide film assumed as "1"

COMPARATIVE EXAMPLE 1

A semiconductor device with the structure as shown in FIG. 2 and a semiconductor device with the structure as shown in FIG. 6 were manufactured in the same way as in Example 1 except that low pressure CVD was performed on conditions that the pressure inside the silicon oxy nitride forming furnace was 0.7 Torr, and that the $N_2O$ gas with a flow rate of 100 ml/minute, NH₃ gas with a flow rate of 100 ml/minute, and DCS gas with a flow rate of 75 ml/minute were introduced into the forming furnace in this order.

As shown in Table 1, the DHF etching ratio and BHF etching ratio were 0.69 and 0.35 in the silicon oxy nitride obtained in Comparative Example 1, and it is understood that the gate oxide film is etched more quickly than the silicon oxy nitride when the wet etching operation is performed using the DHF or BHF.

In the case of Comparative Example 1, a lacking portion occurred under the sidewall spacer, and the reliability degraded in the obtained semiconductor device.

COMPARATIVE EXAMPLE 2

Figure 20:
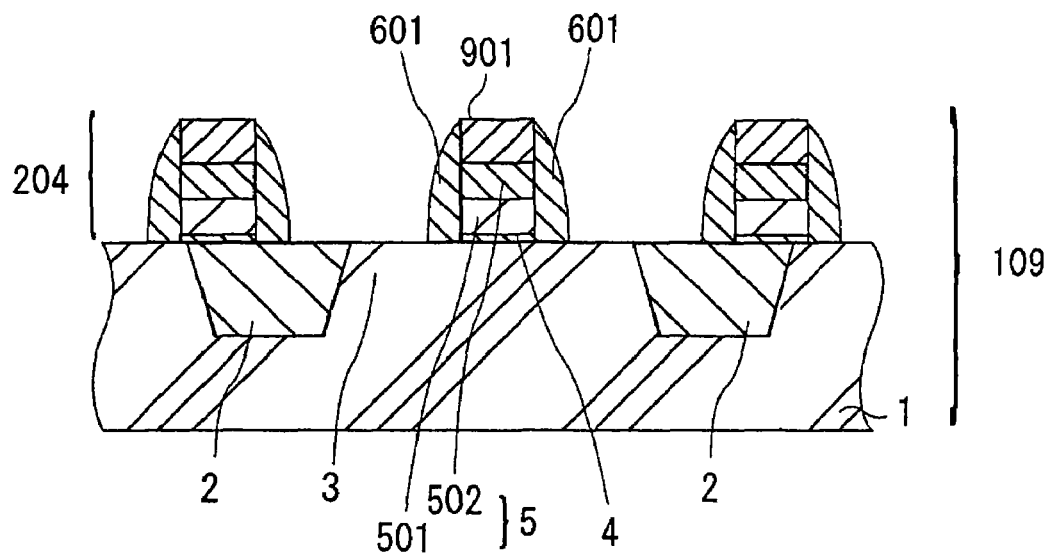
FIG. 20 is a schematic cross-sectional view of principal part illustrating a conventional semiconductor device (Comparative Example 2)

As in the case of Example 1, the layer 601 comprised of silicon nitride was formed on the side surfaces of the gate electrodes 5 comprised of the polysilicon 501 including n-type impurities and tungsten 502 and on the side surfaces and upper surfaces of the gate wiring upper structures 901 comprised of silicon nitride as shown in FIG. 8, and then, by performing anisotropic etching, a semiconductor device 109 with the structure as shown in FIG. 20 was obtained.

In the semiconductor device 109 obtained by Comparative Example 2, since the gate oxide film does not exit, a lacking portion does not occur under the side wall spacer.

However, the side wall spacer imposed strong stress on the semiconductor silicon substrate 1, and therefore, in the semiconductor device 109 obtained by Comparative Example 2, the ON current significantly decreased with the passage of time, and the junction leak current increased, as compared with the semiconductor device as shown in FIG. 2 obtained by Example 1.

Figure 21:
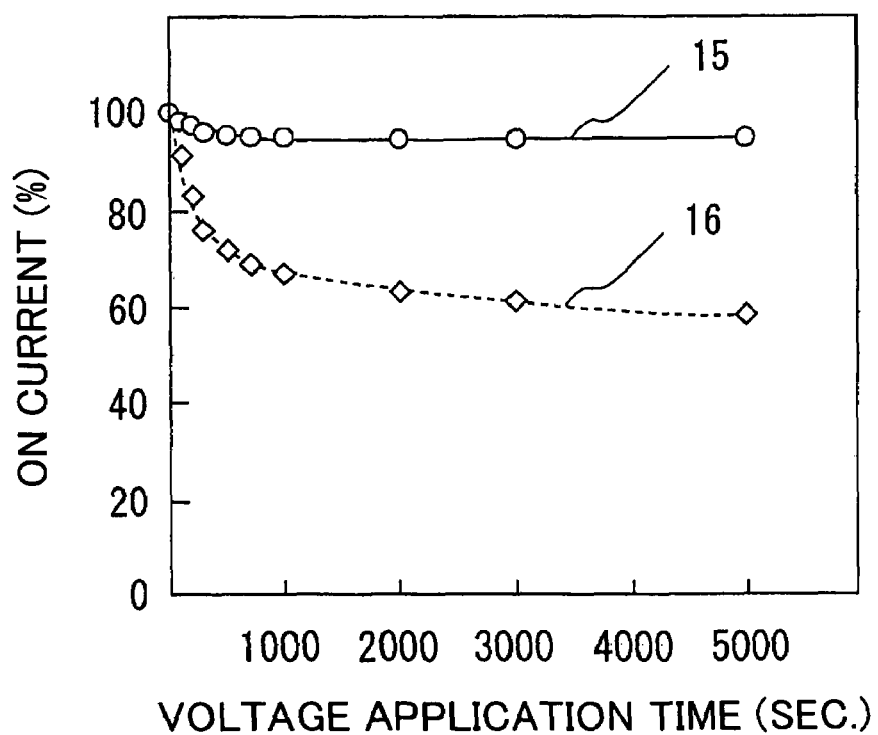
FIG. 21 is a graph illustrating the relationship between the voltage application time and ON current of each semiconductor device.
Figure 22:
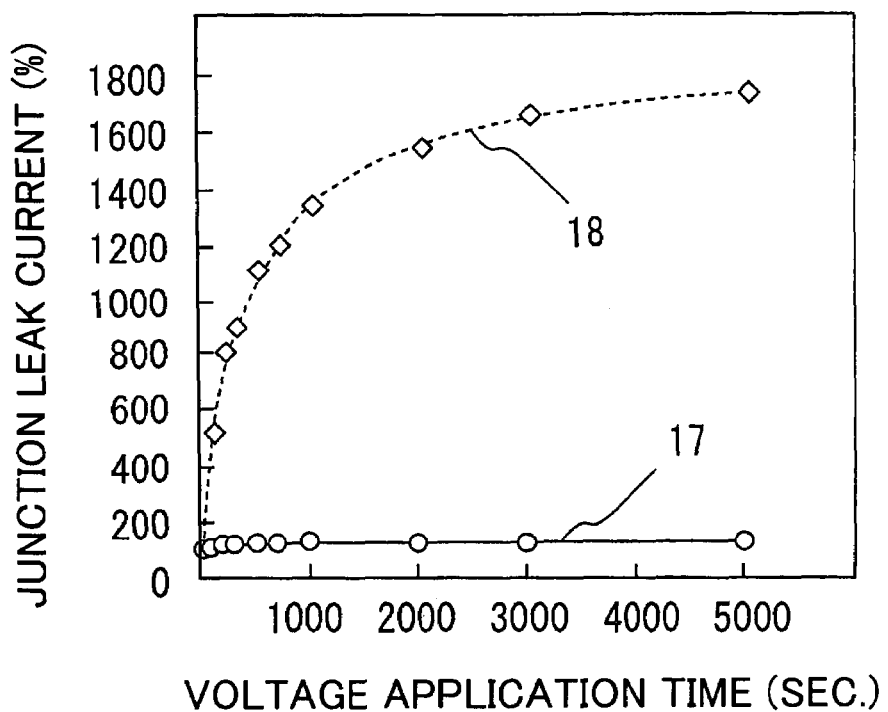
FIG. 22 is a graph illustrating the relationship between the voltage application time and junction leak current of each semiconductor device.

The results are shown in graphs in FIGS. 21 and 22.

In addition, to measure the ON current and junction leak current, TEG (Test Element Group) according to the semiconductor device 109 was separately fabricated, and used for the measurement. Following measurement was performed in the same way.

In FIG. 21, the solid line 15 represents the case of Example 1, while the dashed line 16 represents the case of Comparative Example 2.

Further, In FIG. 22, the solid line 17 represents the case of Example 1, while the dashed line 18 represents the case of Comparative Example 2.

COMPARATIVE EXAMPLE 3

Figure 23:
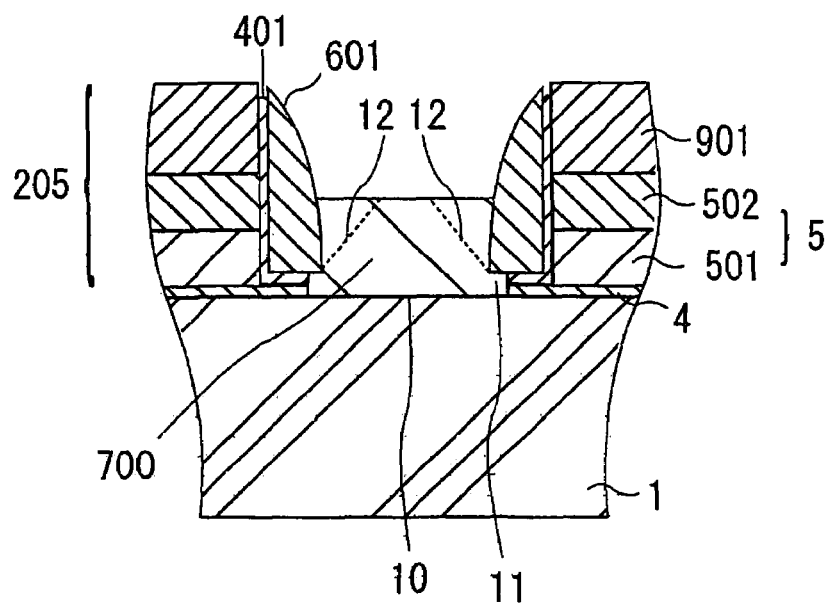
FIG. 23 is a schematic cross-sectional view of principal part illustrating the conventional semiconductor device provided with the elevated source/drain structures.

As in the case of Example 1, a semiconductor device was fabricated with a layer 401 comprised of silicon oxide formed by CVD, as shown in FIG. 23, as a substitute for the inorganic compound insulating layer 801 comprised of silicon oxy nitride as shown in FIG. 6.

In the semiconductor device as shown in FIG. 23, the wet etching operation using BHF or DHF was performed to remove corresponding silicon oxide existing on the surface 10 of the semiconductor silicon substrate 1 prior to formation of the elevated source/drain structures 700 on the semiconductor silicon substrate 1. In both cases of using BHF and DHF, a lacking portion occurred in the interface portion of the side wall spacer and substrate in FIG. 23.

Further, when the elevated source/drain structures 700 were formed on the semiconductor silicon substrate 1 by the selective epitaxial growth method, laminate defects 12 with a plane direction of (111) occurred in the elevated source/drain structures 700.

The junction leak current was measured in the semiconductor device of each of Example 1, Example 4 and Comparative Example 3.

Figure 24:
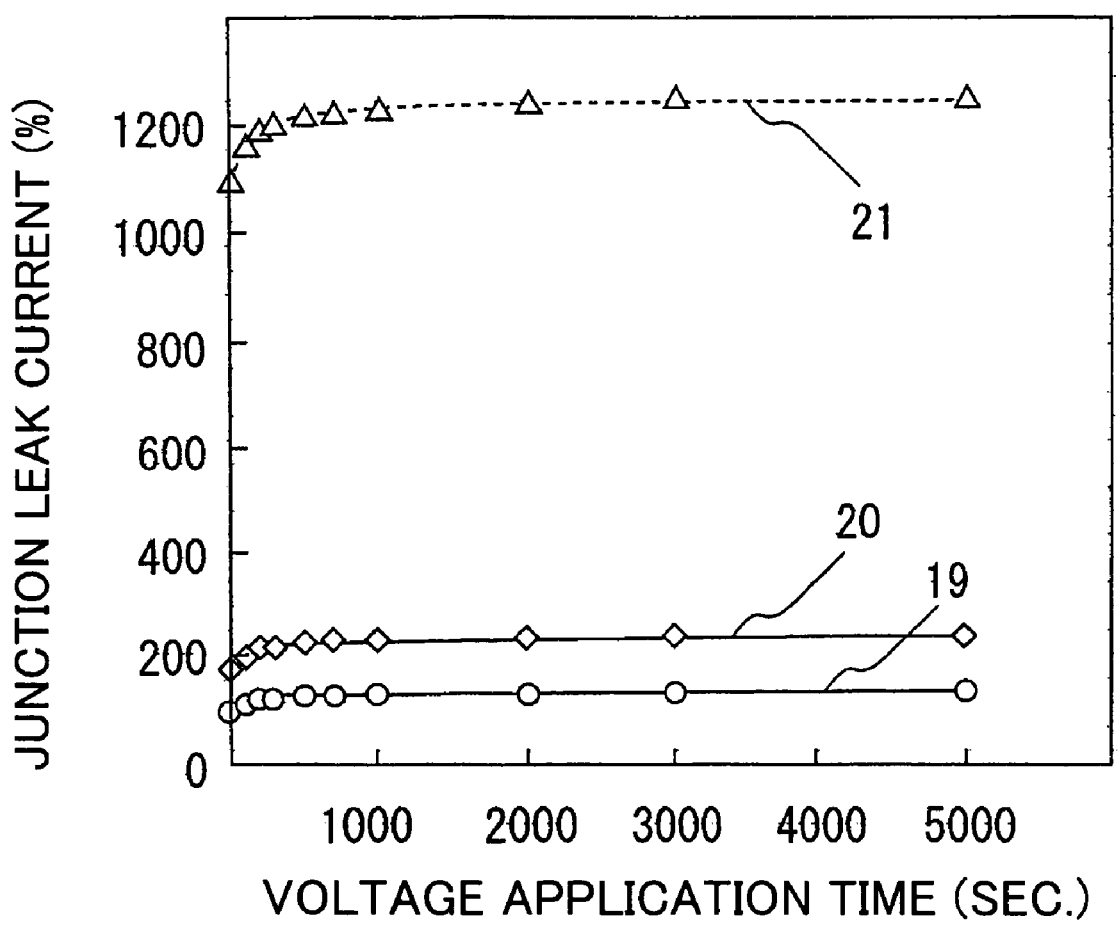
FIG. 24 is a graph illustrating the relationship between the voltage application time and junction leak current of each semiconductor device.

Results are shown in the graph in FIG. 24.

In FIG. 24, the solid line 19 represents the case of Example 6, the solid line 20 represents the case of Example 1, and the dashed line 21 represents the case of Comparative Example 3.

In addition, comparison between Example 1, Example 6 and Comparative Example 3 was made using respective semiconductor devices each with the elevated source/drain structure.

COMPARATIVE EXAMPLE 4

Figure 25:
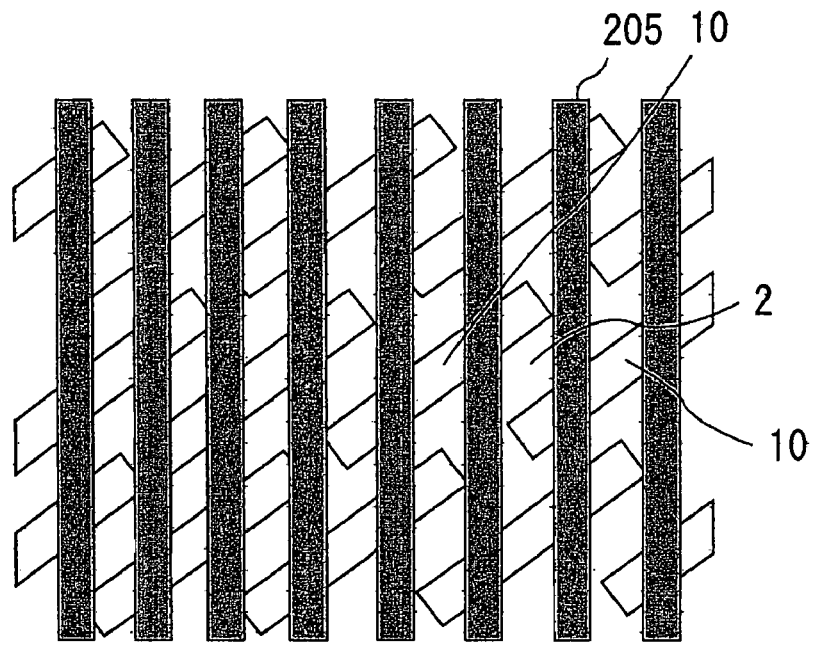
FIG. 25 is a plan view of a semiconductor device of Comparative Example 3 as seen from above gate wiring.

FIG. 25 is a plan view of the semiconductor device of Comparative Example 3 as seen from above the gate wiring 204. In addition, FIG. 25 shows a structure prior to formation of the elevated source/drain structures 700.

Figure 26:
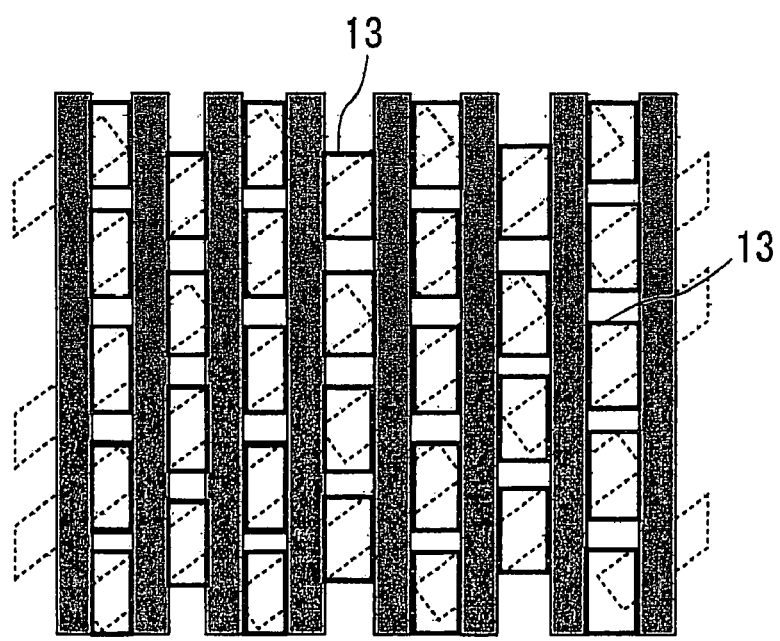
FIG. 26 is a plan view of the semiconductor device of Comparative Example 3 as seen from above gate wiring to explain the step of forming a contact plug.
Figure 27:
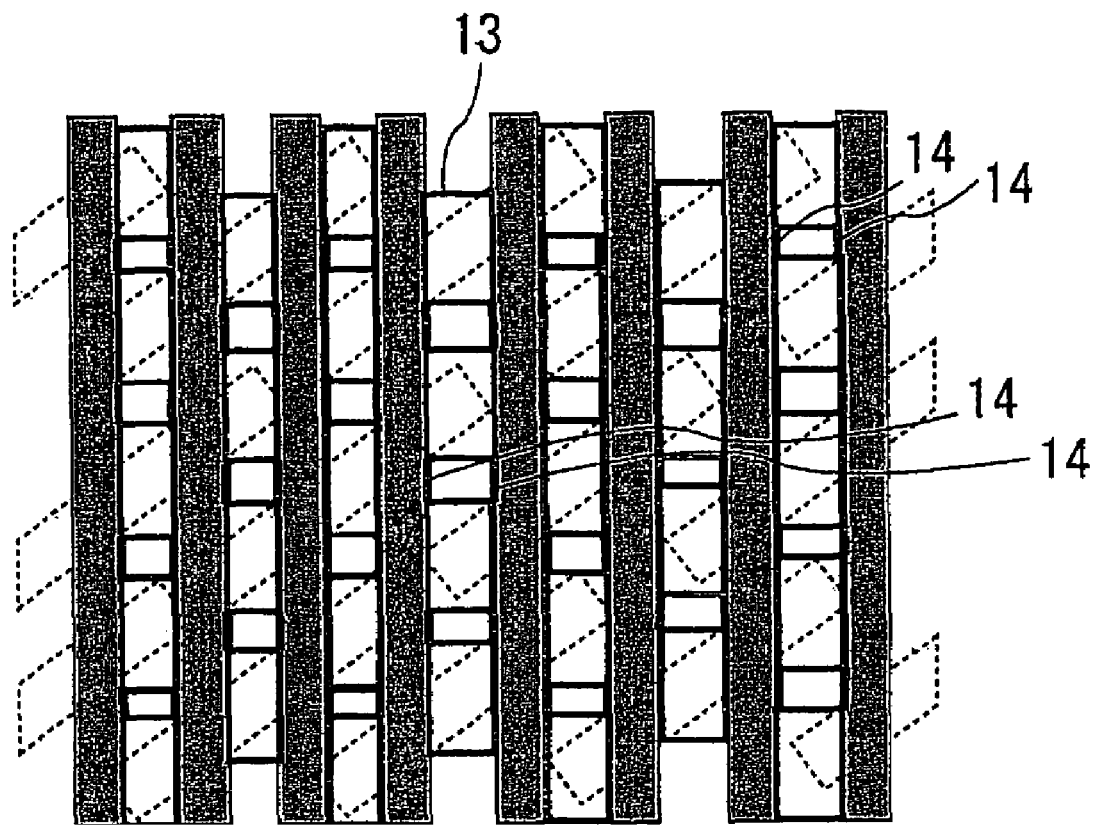
FIG. 27 is a plan view of the semiconductor device of Comparative Example 3 as seen from above gate wiring to illustrate a state where each contact plug has electrical continuity.

FIG. 26 shows a structure where polysilicon including impurities to be the contact plugs 13 are formed on the upper surface of the impurity diffusion layer 3 of FIG. 25.

When the lacking portion 11 occurs under the side wall spacer of the gate wiring as in FIG. 23 described in Comparative Example 3, the polysilicon 14 including the impurities is formed in the lacking portion 11 under the side wall spacer. Therefore, the contact plugs 13 become electrically short-circuited mutually, and the reliability degrades in the obtained semiconductor device.

The present invention is not limited to the above described embodiments, and various variations and modifications may be possible without departing from the scope of the present invention.

This application is based on the Japanese Patent application No. 2005-147308 filed on May 19, 2005, entire content of which is expressly incorporated by reference herein.

What is claimed is:

1. A semiconductor device comprising:
   a semiconductor silicon substrate;
   an impurity diffusion layer provided in a surface region of the semiconductor silicon substrate;
   an element isolation insulating layer provided in the surface region of the semiconductor silicon substrate; and
   gate wiring provided on the semiconductor silicon substrate via a gate oxide film,
   wherein the gate wiring has a gate electrode comprised of at least one selected from the group consisting of metal, metal silicide and polysilicon including impurities, a gate wiring upper structure comprised of silicon nitride provided in contact with the gate electrode, and a sidewall spacer provided in contact with both a side surface of the gate electrode and a side surface of the gate wiring upper structure,
   the side wall spacer is comprised of one kind or two or more kinds of inorganic compound insulating layers, and
   at least one kind of the inorganic compound insulating layers is comprised of silicon oxy nitride composed of silicon, oxygen and nitrogen in which a nitrogen content is in the range of 30 to 70% on a percentage basis of the number of nitrogen atoms to the sum of the numbers of oxygen atoms and nitrogen atoms.

2. The semiconductor device according to claim 1, wherein the side wall spacer is comprised of a first inorganic compound insulating layer comprised of silicon oxy nitride with the nitrogen content ranging from 30 to 70% provided in contact with the side surface of the gate electrode, the side surface of the gate wiring upper structure and the gate oxide film, and
   a second inorganic compound insulating layer comprised of silicon nitride provided in contact with the first inorganic compound insulating layer.

3. The semiconductor device according to claim 1, wherein the side wall spacer is comprised of a first inorganic compound insulating layer comprised of silicon oxy nitride with the nitrogen content ranging from 30 to 50% provided in contact with the side surface of the gate electrode, the side surface of the gate wiring upper structure and the gate oxide film,
  a second inorganic compound insulating layer comprised of silicon oxy nitride with the nitrogen content ranging from 50 to 70% provided in contact with the first inorganic compound insulating layer, and
  a third inorganic compound insulating layer comprised of silicon nitride provided in contact with the second inorganic compound insulating layer.

4. The semiconductor device according to claim 1, wherein the side wall spacer is comprised of silicon oxy nitride with the nitrogen content ranging from 30 to 70% provided in contact with the side surface of the gate electrode, the side surface of the gate wiring upper structure and the gate oxide film.

5. The semiconductor device according to claim 1, wherein the nitrogen content relative to the silicon oxy nitride increases successively with reference to positions to come into contact with the side surface of the gate electrode, the side surface of the gate wiring upper structure and the gate oxide film.

6. The semiconductor device according to claim 1, further comprising:
  at least one selected from the group consisting of an elevated source structure and an elevated drain structure provided in contact with the semiconductor silicon substrate in a predetermined position on the semiconductor silicon substrate.

7. A method of manufacturing a semiconductor device, having the steps of:
  (1) forming an impurity diffusion layer and an element isolation insulating layer in a surface region of a semiconductor silicon substrate;
  (2) forming a gate oxide film on the semiconductor silicon substrate; and
  (3) further forming on the gate oxide film gate wiring having a gate electrode comprised of at least one selected from the group consisting of metal, metal silicide and polysilicon including impurities,
  a gate wiring upper structure comprised of silicon nitride provided in contact with the gate electrode, and
  a side wall spacer provided in contact with both a side surface of the gate electrode and a side surface of the gate wiring upper structure,
  wherein the side wall spacer is formed of one kind or two or more kinds of inorganic compound insulating layers respectively comprised of one kind or two or more kinds of inorganic compounds, and
  at least one kind of the inorganic compound insulating layers is formed of silicon oxy nitride comprised of silicon, oxygen and nitrogen in which a nitrogen content is in the range of 30 to 70% on a percentage basis of the number of nitrogen atoms to the sum of the numbers of oxygen atoms and nitrogen atoms.

8. The method of manufacturing a semiconductor device according to claim 7, wherein the silicon oxy nitride is formed by low pressure CVD in an atmosphere of mixed gas comprised of dichlorsilane gas, ammonia gas and nitrogen monoxide gas in the temperature range of 650 to 750° C.

9. The method of manufacturing a semiconductor device according to claim 7, wherein the method further has the step (4) of wet etching as an essential step, and furthermore has at least one selected from the group consisting of:
  the step (5) of forming at least one (hereinafter, referred to as an "elevated source/drain structure") selected from the group consisting of an elevated source structure and an elevated drain structure in a predetermined position on the semiconductor silicon substrate by a selective epitaxial method, and further forming a contact plug on the elevated source/drain structure, and
  the step (6) of forming a contact plug on the semiconductor silicon substrate.

10. The method of manufacturing a semiconductor device according to claim 9, wherein the step (4) of wet etching is carried out using a hydrofluoric acid containing solution.

11. The method of manufacturing a semiconductor device according to claim 9, wherein at least one kind of the inorganic compound insulating layers constituting the side wall spacer is formed using silicon oxy nitride with a nitrogen content ranging from 50 to 70%, and
  the step (4) of wet etching is carried out using a dilute hydrofluoric acid aqueous solution.

12. The method of manufacturing a semiconductor device according to claim 10, wherein at least one kind of the inorganic compound insulating layers constituting the side wall spacer is formed using silicon oxy nitride with a nitrogen content ranging from 50 to 70%, and
  the step (4) of wet etching is carried out using a dilute hydrofluoric acid aqueous solution.

13. The method of manufacturing a semiconductor device according to claim 9, wherein at least one kind of the inorganic compound insulating layers constituting the side wall spacer is formed using silicon oxy nitride with a nitrogen content ranging from 30 to 50%, and
  the step (4) of wet etching is carried out using a buffer containing dilute hydrofluoric acid aqueous solution.

14. The method of manufacturing a semiconductor device according to claim 10, wherein at least one kind of the inorganic compound insulating layers constituting the side wall spacer is formed using silicon oxy nitride with a nitrogen content ranging from 30 to 50%, and
  the step (4) of wet etching is carried out using a buffer containing dilute hydrofluoric acid aqueous solution.

* * * * *